(12) United States Patent
Kim

(10) Patent No.: US 9,269,667 B2
(45) Date of Patent: Feb. 23, 2016

(54) SEMICONDUCTOR APPARATUS AND AN IMPROVED STRUCTURE FOR POWER LINES

(71) Applicant: SK hynix Inc., Icheon-si, Gyeonggi-do (KR)

(72) Inventor: Su Hyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/227,000

(22) Filed: Mar. 27, 2014

(65) Prior Publication Data

US 2015/0187698 A1 Jul. 2, 2015

(30) Foreign Application Priority Data

Dec. 30, 2013 (KR) .......................... 10-2013-0167003

(51) Int. Cl.
*H01L 23/528* (2006.01)
*G11C 5/06* (2006.01)

(52) U.S. Cl.
CPC ............ *H01L 23/5286* (2013.01); *G11C 5/063* (2013.01)

(58) Field of Classification Search
CPC ............................ H01L 23/50; H01L 23/5286
See application file for complete search history.

(56) References Cited

U.S. PATENT DOCUMENTS

| 6,388,857 B1 * | 5/2002 | Sato et al. ................. 361/111 |
| 2004/0007778 A1 * | 1/2004 | Shinozaki ........... H01L 23/5286 257/759 |
| 2005/0071798 A1 * | 3/2005 | Chung ................ H01L 23/5286 257/207 |
| 2012/0193622 A1 * | 8/2012 | Takahashi ...................... 257/48 |

FOREIGN PATENT DOCUMENTS

| KR | 1020050062183 A | 6/2005 |
| KR | 1020130006819 A | 1/2013 |

* cited by examiner

*Primary Examiner* — Selim Ahmed
*Assistant Examiner* — Wasiul Haider
(74) *Attorney, Agent, or Firm* — William Park & Associates Ltd.

(57) ABSTRACT

A semiconductor apparatus includes a first power supply pad configured to supply a first power; a second power supply pad configured to supply a second power; a first power line configured to be directly electrically coupled to the first power supply pad; and a second power line configured to be directly electrically coupled to the second power supply pad.

19 Claims, 5 Drawing Sheets

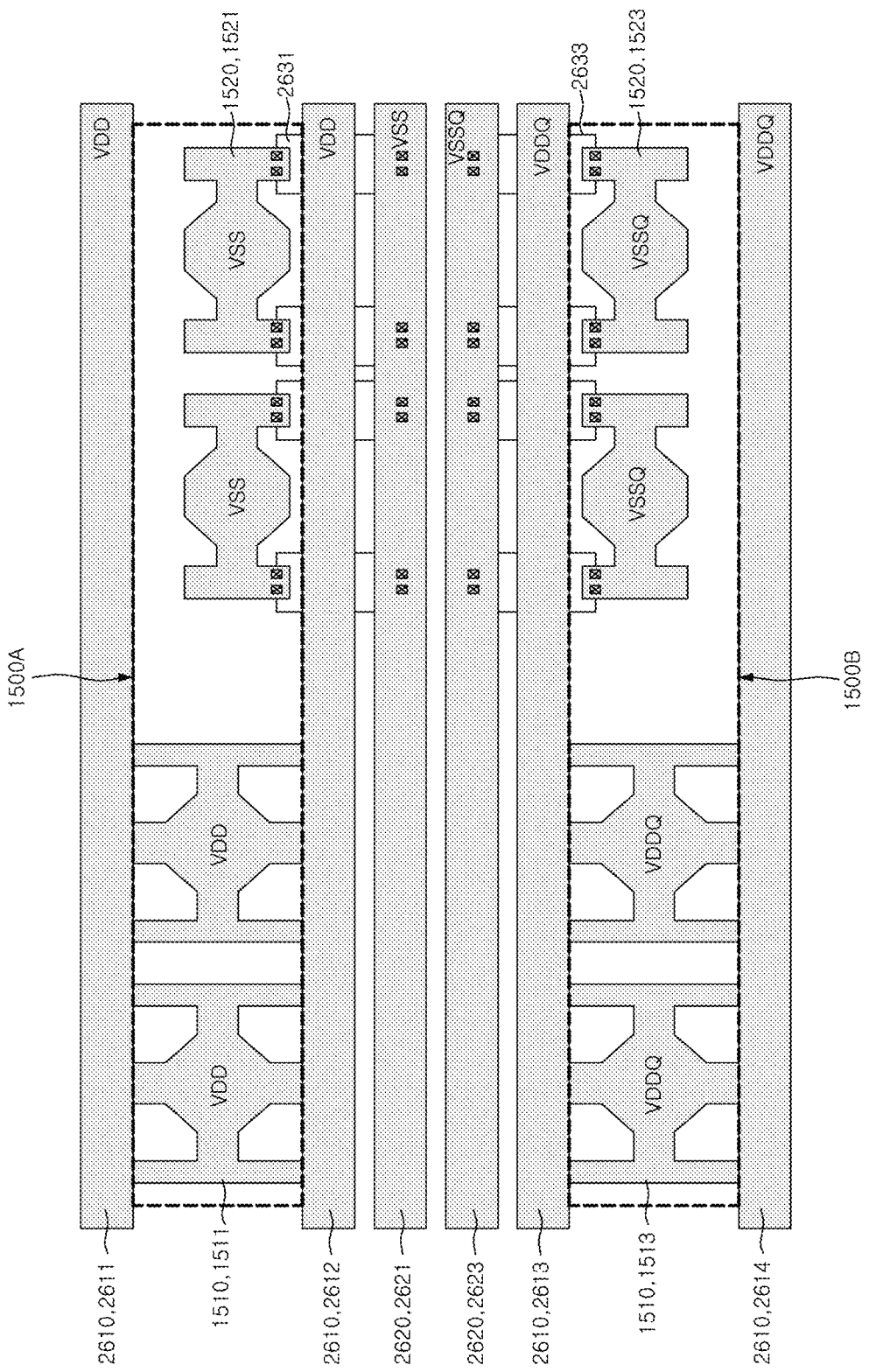

SEMICONDUCTOR APPARATUS AND AN IMPROVED STRUCTURE FOR POWER LINES

CROSS-REFERENCES TO RELATED APPLICATION

The present application claims priority under 35 U.S.C. §119(a) to Korean application number 10-2013-0167003, filed on Dec. 30, 2013, in the Korean Intellectual Property Office, which is incorporated herein by reference in its entirety.

TECHNICAL FIELD

Various embodiments relate to a semiconductor apparatus, and more particularly, to a semiconductor apparatus which can efficiently lay out power lines electrically coupled to power supply pads.

BACKGROUND

A semiconductor apparatus continuously trends toward high degree of integration, high capacity and high speed operation. In particular, various efforts have been made to realize a semiconductor apparatus of high performance within a limited area.

For example, as a semiconductor apparatus trends toward high performance, an increasing number of power lines are needed. As the number of power lines increases in this way, a structure for efficiently laying out the power lines is demanded.

SUMMARY

In an embodiment, a semiconductor apparatus may include: a first power supply pad configured to supply a first power; a second power supply pad configured to supply a second power; a first power line configured to be directly electrically coupled to the first power supply pad; and a second power line configured to be directly electrically coupled to the second power supply pad.

In an embodiment, a semiconductor apparatus may include: one or more pad rows including one or more first power supply pads and one or more second power supply pads; a first power line laid out on one side of the pad rows in a direction perpendicular an the extending direction of the pad rows, and directly electrically coupled to the first power supply pads; and a second power line laid out on an other side of the pad rows in the direction perpendicular to the extending direction of the pad rows, and directly electrically coupled to the second power supply pads.

BRIEF DESCRIPTION OF THE DRAWINGS

FIG. 5 is a diagram explaining the layout structure of power supply pads and power lines in a semiconductor apparatus in accordance with an embodiment.

DETAILED DESCRIPTION

Hereinafter, a semiconductor apparatus will be described below with reference to the accompanying drawings through various to embodiments.

Figure 1:
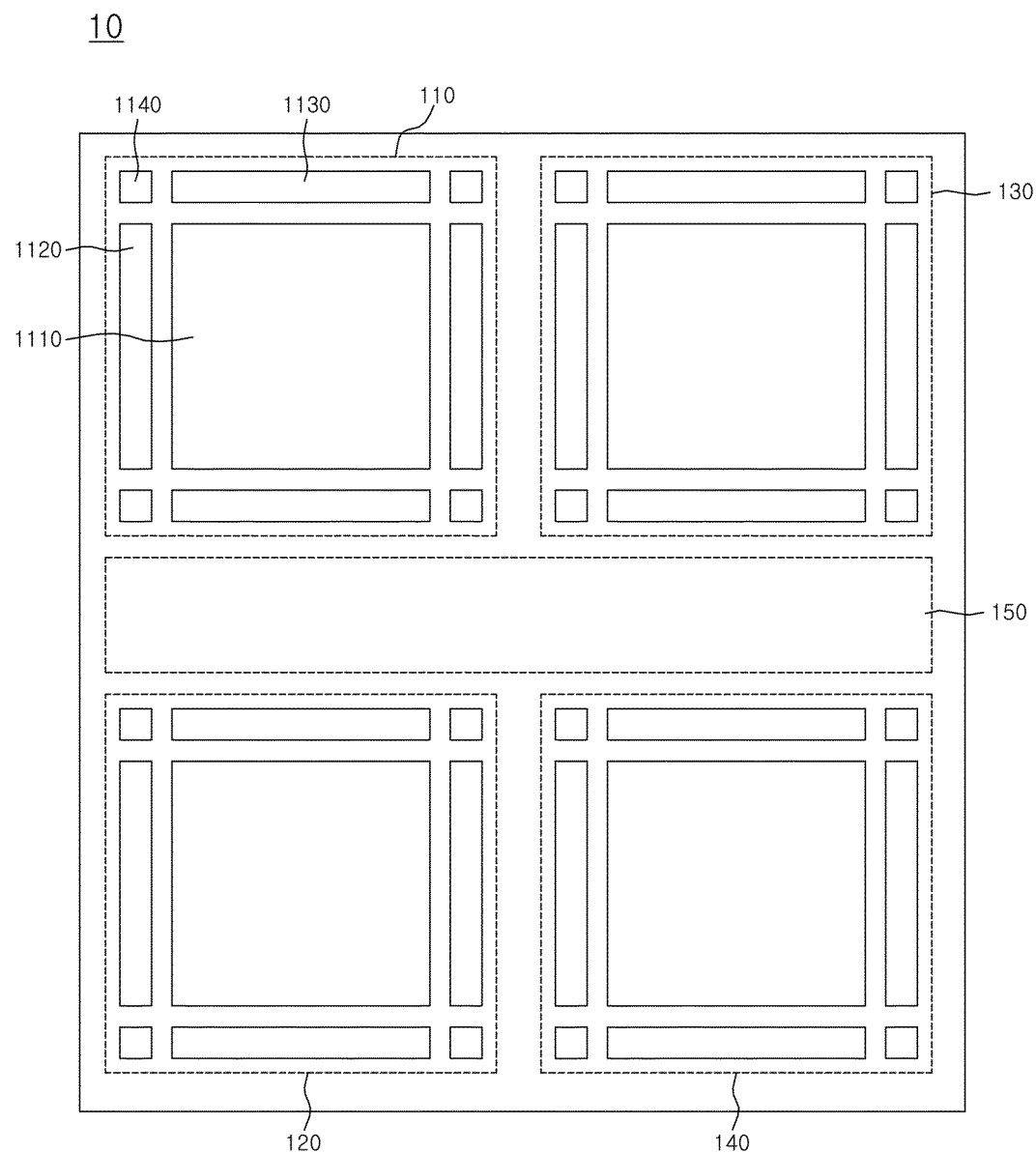
FIG. 1 is a configuration diagram of a semiconductor apparatus in accordance with an embodiment.

Referring to FIG. 1, a semiconductor apparatus 10 in accordance with an embodiment includes a plurality of memory banks 110, 120, 130 and 140. The respective memory banks 110, 120, 130 and 140 are constituted by a plurality of cell mats which are arranged in a matrix type. Each cell mat includes a cell array region 1110, and driving circuit regions 1120, 1130 and 1140 which surround the cell array region 1110.

A plurality of signal lines (not shown) and a plurality of power lines (not shown) may be laid out over the respective memory banks 110, 120, 130 and 140. A plurality of signal lines may be laid out over the cell array region 1110, and a plurality of power lines may be laid out over the driving circuit regions 1120, 1130 and 1140.

The driving circuit regions 1120, 1130 and 1140 may include sense amplifier blocks 1120 which are laid out adjacent to a pair of facing edges of the cell array region 1110; and sub word line driving blocks 1130 which are laid out adjacent to a pair of facing edges of the cell array region 1110 in a direction perpendicular to a direction in which the sense amplifier blocks 1120 are laid out.

The semiconductor apparatus 10 in accordance with an embodiment further includes a peripheral circuit region 150 which is laid out between the plurality of memory banks 110, 120, 130 and 140. An address/command processing unit (not shown), a data input/output processing unit (not shown), a voltage supply unit (not shown), and so forth are laid out in the peripheral circuit region 150. Further, bonding pads (not shown), probing pads (not shown), and so forth may be laid out in the peripheral circuit region 150.

Figure 2:
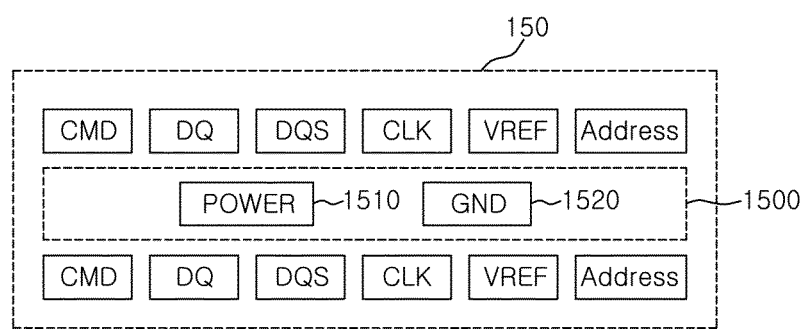
FIG. 2 is a configuration diagram of bonding pads in the semiconductor apparatus shown in FIG. 1.

As shown in FIG. 2, the bonding pads include clock input pads CLK, command input pads CMD, address input pads Address, data strobe pads DQS, data input/output pads DQ, reference voltage pads VREF for input buffers, and a power supply pad array 1500.

The power supply pad array 1500 may be laid out in the peripheral circuit region 150 in such a way as to include one or more row of pads.

The power supply pad array 1500 plays the role of supplying power to the circuits of the semiconductor apparatus, and may include a first power supply pad POWER 1510 for supplying a first power and a second power supply pad GND 1520 for supplying a second power.

Figure 3:
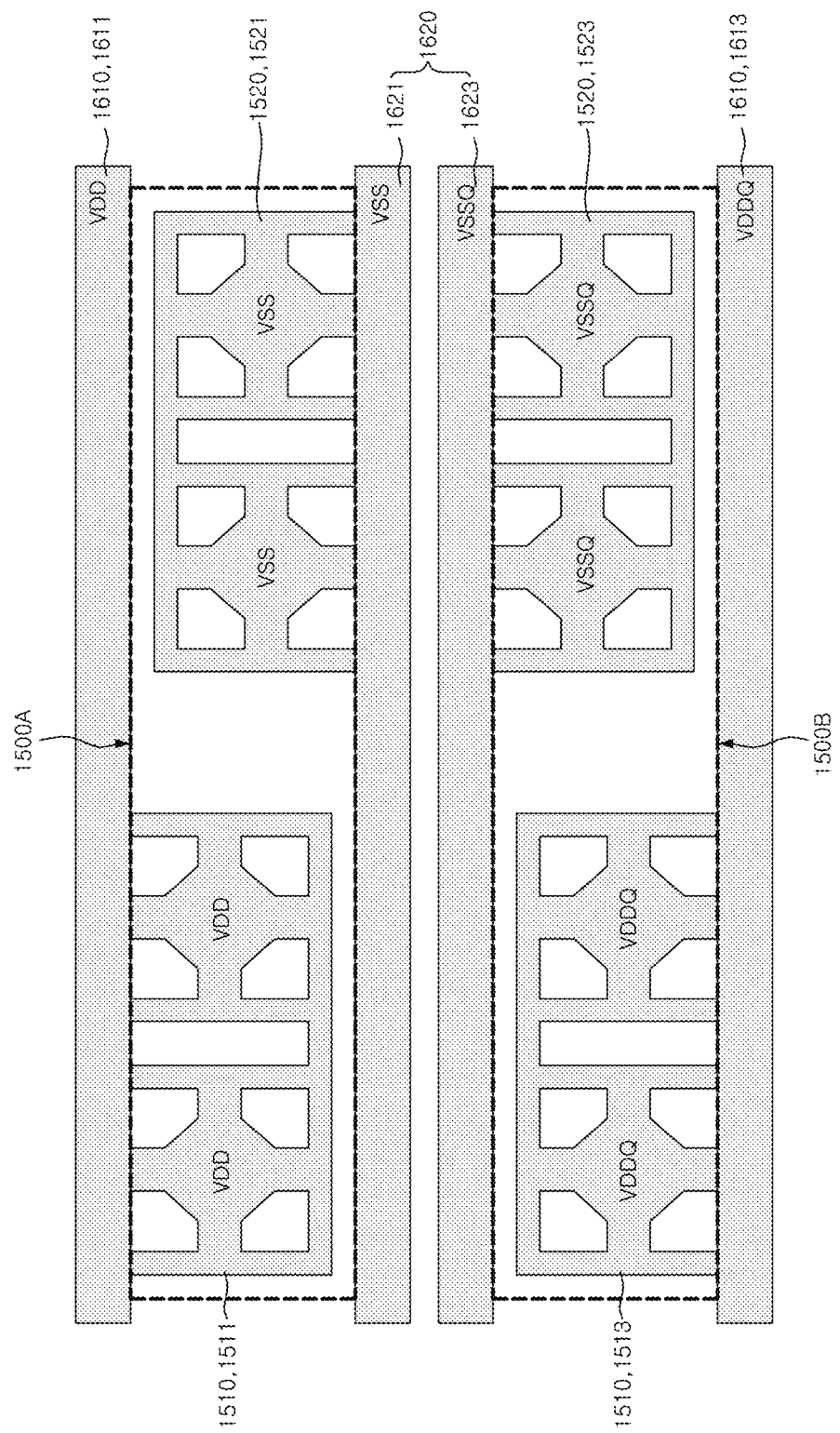
FIG. 3 is a diagram explaining the layout structure of power supply pads and power lines in a semiconductor apparatus in accordance with an embodiment.

Referring to FIG. 3, the first power supply pad POWER 1510 may include power supply voltage pads 1511 (hereinafter, referred to as VDD pads 1511) which may be laid out in a first pad row 1500A and power supply voltage pads 1513 dedicated for output drivers (hereinafter, referred to as VDDQ pads 1513) which may be laid out in a second pad row 1500B.

The second power supply pad GND 1520 may include ground voltage pads 1521 (hereinafter, referred to as VSS pads 1521) which may be laid out in the first pad row 1500A and ground voltage pads 1523 dedicated for output drivers (hereinafter, referred to as VSSQ pads 1523) which may be laid out in the second pad row 1500B.

The power supply pad array 1500 may include a first pad row 1500A, and a second pad row 1500B which is separated from the first pad row 1500A in a first direction. The first direction refers to a direction that is perpendicular to the extending direction of the first pad row 1500A.

The first pad row 1500A may include a plurality of VDD pads 1511 and a plurality of VSS pads 1521. The plurality of VDD pads 1511 and the plurality of VSS pads 1521 may be laid out in a second direction. The second direction refers to the extending direction of the first pad row 1500A.

The second pad row 1500B may include a plurality of VDDQ pads 1513 and a plurality of VSSQ pads 1523. The plurality of VDDQ pads 1513 and the plurality of VSSQ pads 1523 may be laid out in the second direction.

That is to say, each pad row may include both the first power supply pad 1510 and the second power supply pad 1520.

Power lines for supplying power to various kinds of circuits (not shown) of the semiconductor apparatus may be electrically coupled to the power supply pad array 1500. The power lines may include first power lines 1610 which are directly electrically coupled to the first power supply pad 1510, and second power lines 1620 which are directly electrically coupled to the second power supply pad 1520. The first power lines 1610 may be laid out on one side of the pad row 1500A in a direction perpendicular to an extending direction of the pad row 1500A. The second power lines 1620 may be laid out on the other side of the pad row 1500B in the direction perpendicular to the extending direction of the pad row 1500B.

The first power lines 1610 may include a power supply voltage power line 1611 (hereinafter, referred to as a VDD power line 1611) which is directly electrically coupled to the VDD pads 1511; and a power supply voltage power line 1613 dedicated for output drivers (hereinafter, referred to as a VDDQ power line 1613) which is directly electrically coupled to the VDDQ pads 1513 that may be dedicated for an output driver. The VDD power line 1611 and the VDDQ power line 1613 may extend in the second direction.

The second power lines 1620 may include a ground voltage power line 1621 (hereinafter, referred to as a VSS power line 1621) which is directly electrically coupled to the VSS pads 1521; and a ground voltage power line 1623 dedicated for output drivers (hereinafter, referred to as a VSSQ power line 1623) which is directly electrically coupled to the VSSQ pads 1523 that may be dedicated for an output driver. The VSS power line 1621 and the VSSQ power line 1623 may extend in the second direction. The VSS power line 1621 may be laid out on the other side or the one side of the first pad row 1500A in the direction perpendicular to the extending direction of the first pad row 1500A. The VSSQ power line 1623 may be laid out on the other side or the one side of the second pad row in the direction perpendicular to the extending direction of the second pad row 1500B.

For example, the VDD power line 1611, which is directly electrically coupled to the VDD pads 1511, may be laid out on one side or an other side of the first pad row 1500A in the first direction; and the VSS power line 1621, which is directly electrically coupled to the VSS pads 1521, may be laid out on the other side of the first pad row 1500A in the first direction.

The VSSQ power line 1623, which is directly electrically coupled to the VSSQ pads 1523, may be laid out on one side of the second pad row 1500B in the first direction; and the VDDQ power line 1613, which is directly electrically coupled to the VDDQ pads 1513, may be laid out on one side or the other side of the second pad row 1500B in the first direction.

In other words, in the semiconductor apparatus, the first power lines 1610, which are directly electrically coupled to the first power supply pad 1510, may be laid out on the outer sides of the pad rows 1500A and 1500B which include the first power supply pad 1510 and the second power supply pad 1520; and the second power lines 1620, which are directly electrically coupled to the second power supply pad 1520, may be laid out on the inner sides of the pad rows 1500A and 1500B.

According to this fact, since the first power lines 1610 and the second power lines 1620 are directly electrically coupled to the pad rows 1500A and 1500B, it is possible to stably supply the first power and the second power to the various kinds of circuits of the semiconductor apparatus.

Figure 4:
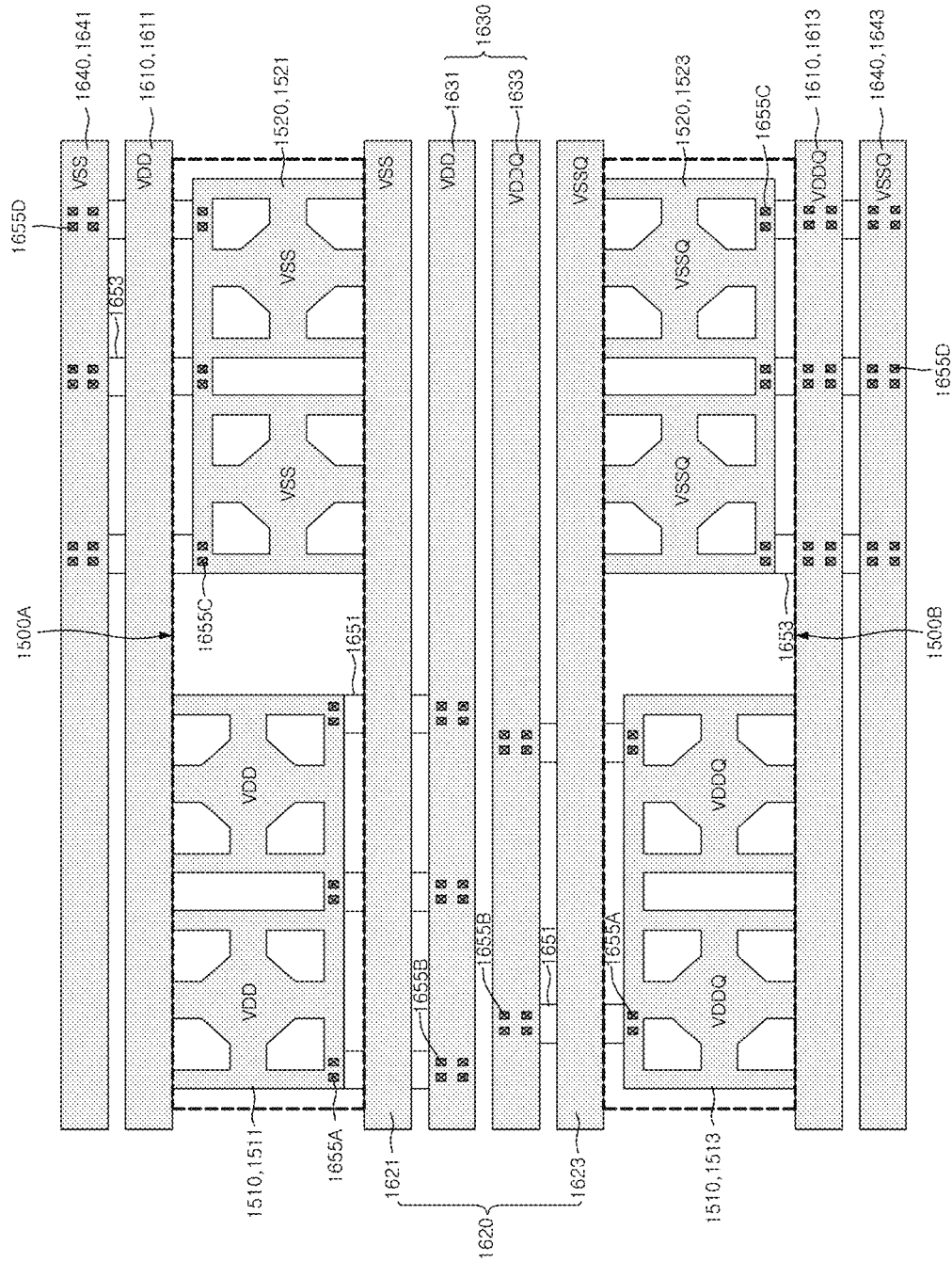
FIG. 4 is a diagram explaining the layout structure of power supply pads and power lines in a semiconductor apparatus in accordance with an embodiment.

A semiconductor apparatus in accordance with an embodiment will be described below with reference to FIGS. 2 and 4.

A power supply pad array 1500 of the semiconductor apparatus may include a first power supply pad 1510 and a second power supply pad 1520. Since the power supply pad array 1500 is configured in the same manner as the power supply pad array 1500 of the aforementioned embodiment above, detailed descriptions thereof will be omitted herein.

Power lines for supplying power to various kinds of circuits (not shown) of the semiconductor apparatus may be electrically coupled to the power supply pad array 1500. The power lines may include first power lines 1610 directly electrically coupled to the first power supply pad 1510; second power lines 1620 directly electrically coupled to the second power supply pad 1520; first auxiliary power lines 1630 indirectly electrically coupled to the first power supply pad 1510; and second auxiliary power lines 1640 indirectly electrically coupled to the second power supply pad 1520. The first power lines 1610 may be laid out above the first and second pad rows 1500A and 1500B and the first auxiliary power lines 1630. The second power lines 1620 may be laid out between the pad row 1500A and the second power auxiliary power lines 1640. The first auxiliary power lines 1630 may be laid out on one side or the other side of the pad row 1500A in the direction perpendicular to the extending direction of the pad row 1500A. The second auxiliary power lines 1640 may be laid out on the other side or the one side of the pad row 1500B in the direction perpendicular to the extending direction of the pad row 1500B.

The first power lines 1610 may include a VDD power line 1611 directly electrically coupled to VDD pads 1511, and a VDDQ power line 1613 directly electrically coupled to VDDQ pads 1513.

The second power lines 1620 may include a VSS power line 1621 directly electrically coupled to VSS pads 1521, and a VSSQ power line 1623 directly electrically coupled to VSSQ pads 1523.

The first auxiliary power lines 1630 may include a power supply voltage auxiliary power line 1631 that may be dedicated for an output driver (hereinafter, referred to as a VDD auxiliary power line 1631) indirectly electrically coupled to the VDD pads 1511; and a power supply voltage auxiliary power line 1633 dedicated for output drivers (hereinafter, referred to as a VDDQ auxiliary power line 1633) indirectly electrically coupled to the VDDQ pads 1513.

The first auxiliary power lines 1630 and pad row are laid out on the same layer as the first power lines 1610 and at positions separated from the first power lines 1610 in the first direction. The first auxiliary power lines 1630 may be electrically coupled to the first power supply pad 1510 through first coupling lines 1651 which extend in the first direction.

The first coupling lines 1651 are laid out on a layer different from the first power supply pad 1510 and the first auxiliary power lines 1630 (for example, on an underlying layer) and the first power lines 1610. The first power supply pad 1510 and the first coupling lines 1651 may be electrically coupled to each other through contacts 1655A. Each pad of the pad row 1500B and the first auxiliary power line 1630 may be electrically coupled to the first coupling lines 1651 through contacts 1655A. The first auxiliary power lines 1630 and the first coupling lines 1651 may be electrically coupled to each other through contacts 1655B.

The second auxiliary power lines 1640 may include a ground voltage auxiliary power line 1641 (hereinafter, referred to as a VSS auxiliary power line 1641) indirectly electrically coupled to the VSS pads 1521; and a ground voltage auxiliary power line 1643 dedicated for output drivers (hereinafter, referred to as a VSSQ auxiliary power line 1643) indirectly electrically coupled to the VSSQ pads 1523. The VSS auxiliary power line 1641 may be laid out on the other side or the one side of the first pad row 1500A in the direction perpendicular to the extending direction of the first pad row 1500A. The VSSQ auxiliary power line 1643 may be laid out on the other side or the one side of the second pad row 1500B in the direction perpendicular to the extending direction of the second pad row 1500B.

The second auxiliary power lines 1640 are laid out on the same layer as the pad row 1500B and the second power lines 1620 and at positions separated from the second power lines 1620 in the first direction. The second auxiliary power lines 1640 may be electrically coupled to the second power supply pad 1520 through second coupling lines 1653 which extend in the first direction.

The second coupling lines 1653 are laid out on a layer different from the second power supply pad 1520 of the pad row 1500A, the second power lines 1620 and the second auxiliary power lines 1640 (for example, on an underlying layer). The second power supply pad 1520 and the second coupling lines 1653 may be electrically coupled to each other through contacts 1655C. Each pad of the pad row 1500B, the second auxiliary power lines 1640 and the second coupling lines 1653 may be electrically coupled to each other through contacts 1655D.

For example, the VDD power line 1611 directly electrically coupled to the VDD pads 1511; and the VSS auxiliary power line 1641 indirectly electrically coupled to the VSS pads 1521 through the second coupling lines 1653, may be laid out on one side of a first pad row 1500A in the first direction. The VDD power line 1611 may be laid out at a position closer to the first pad row 1500A than the VSS auxiliary power line 1641.

The VSS power line 1621, directly electrically coupled to the VSS pads 1521; and the VDD auxiliary power line 1631 indirectly electrically coupled to the VDD pads 1511 through the first coupling lines 1651, may be laid out on one side or the other side of the first pad row 1500A in the first direction. The VDD auxiliary power line 1631 may be indirectly electrically coupled to the VDDQ pads 1513. The VSS power line 1621 may be laid out at a position closer to the first pad row 1500A than the VDD auxiliary power line 1631.

The VDD power line 1611 and the VSS power line 1621 may be laid out at substantially the same distance from the first pad row 1500A; and the VDD auxiliary power line 1631 and the VSS auxiliary power line 1641 may be laid out at substantially the same distance from the first pad row 1500A.

The VSSQ power line 1623 directly electrically coupled to the VSSQ pads 1523; and the VDDQ auxiliary power line 1633 indirectly electrically coupled to the VDDQ pads 1513 through the first coupling lines 1651, may be laid out on one side or the other side of a second pad row 1500B in the first direction. The VSSQ power line 1623 may be laid out at a position closer to the second pad row 1500B than the VDDQ auxiliary power line 1633.

The VDDQ power line 1613 directly electrically coupled to the VDDQ pads 1513; and the VSSQ auxiliary power line 1643 indirectly electrically coupled to the VSSQ pads 1523 through the second coupling lines 1653, may be laid out on the other side of the second pad row 1500B in the first direction. The VDDQ power line 1613 may be laid out at a position closer to the second pad row 1500B than the VSSQ auxiliary power line 1643.

The VDDQ power line 1613 and the VSSQ power line 1623 may be laid out at substantially the same distance from the second pad row 1500B; and the VDDQ auxiliary power line 1633 and the VSSQ auxiliary power line 1643 may be laid out at substantially the same distance from the second pad row 1500B.

In other words, the first power lines 1610 directly electrically coupled to the first power supply pad 1510 and the second auxiliary power lines 1640 indirectly electrically coupled to the second power supply pad 1520, may be laid out on the outer sides of the pad rows 1500A and 1500B. The pad rows 1500A may include the first power supply pad 1510; the second power supply pad 1520; the second power lines 1620 which are directly electrically coupled to the second power supply pad 1520; and the first auxiliary power lines 1630, which are indirectly electrically coupled to the first power supply pad 1510 and may be laid out on the inner sides of the pad rows 1500A and 1500B.

In the above-described structure, the first and second power lines 1610 and 1620 may be laid out at substantially the same distance from the pad rows 1500A and 1500B; and the first and second auxiliary power lines 1630 and 1640 may be laid out at substantially the same distance from the pad rows 1500A and 1500B.

According to this fact, since the first power lines 1610 and the second power lines 1620 are directly electrically coupled to the pad rows 1500A and 1500B and laid out between the pad rows 1500A and 1500B and the first auxiliary power lines 1630 and the second auxiliary power lines 1640 are indirectly electrically coupled to the pad rows 1500A and 1500B as described above, it is possible to stably supply a first power and a second power to the various kinds of circuits of the semiconductor apparatus.

A semiconductor apparatus in accordance with an embodiment will be described below with reference to FIGS. 2 and 5.

A power supply pad array 1500 of the semiconductor apparatus may include a first power supply pad 1510 and a second power supply pad 1520. Since the power supply pad array 1500 is configured in the same manner as the power supply pad array 1500 of the aforementioned embodiments, detailed descriptions thereof will be omitted herein.

Power lines for supplying power to various kinds of circuits (not shown) of the semiconductor apparatus may be electrically coupled to the power supply pad array 1500.

The power lines may include first power lines 2610 directly electrically coupled to the first power supply pad 1510, and second power lines 2620 indirectly electrically coupled to the second power supply pad 1520.

The first power lines 2610 may include VDD power lines 2611 and 2612 which are directly electrically coupled to VDD pads 1511, and VDDQ power lines 2613 and 2614 which are directly electrically coupled to VDDQ pads 1513.

The VDD power lines 2611 and 2612 may include a first VDD power line 2611 which is laid out on one side of a first pad row 1500A in the first direction, and a second VDD power line 2612 which is laid out on the other side of the first pad row 1500A in the first direction.

The VDDQ power lines 2613 and 2614 may include a first VDDQ power line 2613 laid out on one side of a second pad row 1500B in the first direction; and a second VDDQ power line 2614 laid out on the other side of the second pad row 1500B in the first direction.

The second power lines 2620 may include a VSS power line 2621 indirectly electrically coupled to VSS pads 1521 through first coupling lines 2631 extending in the first direction; and a VSSQ power line 2623 indirectly electrically coupled to VSSQ pads 1523 through second coupling lines 2633 extending in the first direction.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
a first power line arranged in a first direction;
a second power line arranged to be parallel to the first power line;
a first power supply pad arranged between the first power line and the second power line to be directly connected to the first power line,
wherein an entire portion of the first power supply pad is arranged between the first power line and the second power line; and
a second power supply pad arranged between the first power line and the second power line and directly connected to the second power line,
wherein an entire portion of the second power supply pad is arranged between the first power line and the second power line;
a first auxiliary power line arranged to be parallel to the first power line and electrically coupled with the first power supply pad; and
a second auxiliary power line arranged to be parallel to the second power line and electrically coupled with the second power supply pad,
wherein the first power supply pad and the second power supply pad are arranged in a line.

2. The semiconductor apparatus according to claim 1, wherein the first power supply pad comprises:
a power supply voltage pad and a power supply voltage pad dedicated for an output driver, and
the first power line comprises:
a first power supply voltage power line which is electrically coupled to the power supply voltage pad, and a second power supply voltage power line dedicated for an output driver, which is electrically coupled to the power supply voltage pad dedicated for an output driver.

3. The semiconductor apparatus according to claim 1, wherein the second power supply pad comprises:
a first ground voltage pad and a second ground voltage pad dedicated for an output driver, and
wherein the second power line comprises:
a first ground voltage power line which is electrically coupled to the first ground voltage pad, and a second ground voltage power line dedicated for an output driver, which is electrically coupled to the ground voltage pad dedicated for an output driver.

4. A semiconductor apparatus comprising:
one or more pad rows including one or more first power supply pads and one or more second power supply pads;
a first power line configured on one side of the pad rows in a direction perpendicular to the extending direction of the pad rows, and electrically coupled to the first power supply pads,
wherein an entire portion of the first power supply pads is arranged between the first power line and a second power line;
the second power line configured on an other side of the pad rows in the direction perpendicular to the extending direction of the pad rows, and directly electrically coupled to the second power supply pads,
wherein an entire portion of the second power supply pads is arranged between the first power line and the second power line;
a first auxiliary power line arranged to be parallel to the first power line and adjacent to the first power line; and
a second auxiliary power line arranged to be parallel to the second power line and adjacent to the second power line.

5. The semiconductor apparatus according to claim 4, wherein the pad rows comprise:
a first pad row and a second pad row separated from the first pad row in a direction perpendicular to an extending direction of the first pad row.

6. The semiconductor apparatus according to claim 5, wherein the first power supply pads comprise:
a power supply voltage pad configured in the first pad row, and a power supply voltage pad dedicated for an output driver, and configured in the second pad row, and
wherein the first power line comprises:
a first power supply voltage power line configured on one side or the other side of the first pad row in the direction perpendicular to the extending direction of the first pad row, and electrically coupled to the power supply voltage pad; and
a second power supply voltage power line dedicated for the output driver, configured on one side or the other side of the second pad row in the direction perpendicular to the extending direction of the second pad row, and electrically coupled to the power supply voltage pad dedicated for an output driver.

7. The semiconductor apparatus according to claim 6, wherein the first auxiliary power line comprises:
a first power supply voltage auxiliary power line laid out on the one side or the other side of the first pad row in the direction perpendicular to the extending direction of the first pad row, and indirectly electrically coupled to the power supply voltage pad; and
a second power supply voltage auxiliary power line dedicated for an output driver, configured on the one side or the other side of the second pad row in the direction perpendicular to the extending direction of the second pad row, and indirectly electrically coupled to the power supply voltage pad dedicated for the output driver.

8. The semiconductor apparatus according to claim 7, wherein the first power line is configured above the pad row and the first auxiliary power line.

9. The semiconductor apparatus according to claim 8, wherein each pad of the pad row and the first auxiliary power line are electrically coupled to a first coupling line.

10. The semiconductor apparatus according to claim 9, wherein the pad row, the first power line and the first auxiliary power line are configured on substantially the same layer, and
wherein the first coupling line is configured on a layer different from the pad row, the first power line and the first auxiliary power line.

11. The semiconductor apparatus according to claim 5, wherein the second power supply pad comprises:
a first ground voltage pad which is configured in the first pad row, and a second ground voltage pad dedicated for an output driver, which is configured in the second pad row, and
wherein the second power line comprises:
a first ground voltage power line configured on the other side or the one side of the first pad row in the direction perpendicular to the extending direction of the first pad row, and electrically coupled to the ground voltage pad; and
a second ground voltage power line dedicated for the output driver, configured on the other side or the one side of the second pad row in the direction perpendicular to the extending direction of the second pad row, and electrically coupled to the ground voltage pad dedicated for an output driver.

12. The semiconductor apparatus according to claim 11, wherein the second auxiliary power line comprises:
a ground voltage auxiliary power line configured on the other side or the one side of the first pad row in the direction perpendicular to the extending direction of the first pad row, and indirectly electrically coupled to the ground voltage pad; and
a ground voltage auxiliary power line dedicated for the output driver, configured on the other side or the one side of the second pad row in the direction perpendicular to the extending direction of the second pad row, and indirectly electrically coupled to the ground voltage pad dedicated for an output driver.

13. The semiconductor apparatus according to claim 12, wherein the second power line is configured between the pad row and the second auxiliary power line.

14. The semiconductor apparatus according to claim 13, wherein each pad of the pad row and the second auxiliary power line are electrically coupled to a second coupling line.

15. The semiconductor apparatus according to claim 14,
wherein the pad row, the second power line and the second auxiliary power line are configured on substantially the same layer, and
wherein the second coupling line is configured on a layer different from the pad row, the second power line or the second auxiliary power line.

16. The semiconductor apparatus according to claim 4, wherein the first power line and the second power line are configured at substantially the same distance from the pad row.

17. The semiconductor apparatus according to claim 5,
wherein the first auxiliary power line is indirectly electrically coupled to the first power supply pad of the pad row and the second auxiliary power line is indirectly electrically coupled to the second power supply pad of the pad row, and
wherein the first auxiliary power line and the second auxiliary power line are configured at substantially the same distance from the pad row.

18. The semiconductor apparatus according to claim 17, wherein the first power lines are configured on an outer side of the first pad row and the second pad row.

19. The semiconductor apparatus according to claim 18, wherein the second power lines are configured on an inner side of the first pad row and the second pad row.

* * * * *